(12) United States Patent
Kang

(10) Patent No.: US 8,054,695 B2
(45) Date of Patent: Nov. 8, 2011

(54) SEMICONDUCTOR MEMORY APPARATUS

(75) Inventor: Khil Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 261 days.

(21) Appl. No.: 12/494,969

(22) Filed: Jun. 30, 2009

(65) Prior Publication Data

US 2010/0118639 A1    May 13, 2010

(30) Foreign Application Priority Data

Nov. 13, 2008  (KR) .................. 10-2008-0112584

(51) Int. Cl.
*G11C 5/14*  (2006.01)

(52) U.S. Cl. .............. 365/189.09; 365/189.05; 365/201; 365/230.08

(58) Field of Classification Search .............. 365/189.09, 365/189.05, 201, 230.08, 233.12
See application file for complete search history.

(56) References Cited

U.S. PATENT DOCUMENTS

| | | | |
|---|---|---|---|
| 6,549,480 B2 * | 4/2003 | Hosogane et al. ............ | 365/226 |
| 6,940,765 B2 | 9/2005 | Kyung | |
| 7,643,356 B2 * | 1/2010 | Do ........................... | 365/189.09 |
| 2009/0122634 A1 * | 5/2009 | Kang ............................ | 365/226 |
| 2009/0219775 A1 * | 9/2009 | Hur et al. ...................... | 365/201 |

FOREIGN PATENT DOCUMENTS

| | | |
|---|---|---|
| JP | 2002-133867 | 5/2002 |
| JP | 2007-200542 | 8/2007 |
| KR | 10-1997-0060695 | 8/1997 |
| KR | 1020000004506 | 1/2000 |
| KR | 10-2005-0090256 | 9/2005 |

\* cited by examiner

*Primary Examiner* — Son Dinh
*Assistant Examiner* — Toan Le
(74) *Attorney, Agent, or Firm* — Venable LLP; Jeffri A. Kaminski

(57) ABSTRACT

A reference voltage selecting unit selectively outputs a first external reference voltage and a second external reference voltage as a selection reference voltage in accordance with whether to perform a wafer test. An address buffer generates an internal address by buffering an external address in accordance with the selection reference voltage. A command buffer generates an internal command by buffering an external command in accordance with the selection reference voltage. A data buffer generates internal data by buffering an external data in accordance with the second external reference voltage.

8 Claims, 3 Drawing Sheets

SEMICONDUCTOR MEMORY APPARATUS

CROSS-REFERENCES TO RELATED PATENT APPLICATION

The present application claims priority under 35 U.S.C 119(a) to Korean Application No. 10-2008-0112584, filed on Nov. 13, 2008, in the Korean Intellectual Property Office, which is incorporated herein by reference in its entirety as set forth in full.

BACKGROUND

1. Technical Field

The embodiment described herein relates to a semiconductor integrated circuit, particularly a semiconductor memory apparatus.

2. Related Art

A conventional semiconductor memory apparatus, as shown in FIG. 1, is configured to include an address buffer 10, a command buffer 20, and a data buffer 30.

The address buffer 10 generates an internal address 'add_int' by buffering an external address 'add_ext' in accordance with a first external reference voltage 'Vref_ext1'.

The command buffer 20 generates an internal command 'com_int' by buffering an external command 'com_ext' in accordance with the first external reference voltage 'Vref_ext1'.

The data buffer 30 generates an internal data 'data_int' by buffering an external data 'data_ext' in accordance with a second external reference voltage 'Vref_ext2'.

The external address 'add_ext', the external command 'com_ext', the external data 'data_ext', the first external reference voltage 'Vref_ext1', and the second external reference voltage 'Vref_ext2' are inputted from the outside of the semiconductor memory apparatus through corresponding pads, in which the first external reference voltage 'Vref_ext1' and the second external reference voltage 'Vref_ext2' may be at the same voltage level.

Due to the operational speed of semiconductor memory apparatuses rapidly increasing, in order to provide a stable operation of the semiconductor memory apparatuses, the semiconductor memory apparatuses are designed such that voltages are applied to a circuit that consumes large current and a circuit that consumes small current through different power sources.

The data buffer 30 consumes larger current than the address buffer 10 and the command buffer 20. Therefore, the first external reference voltage 'Vref_ext1' is applied to the address buffer 10 and the command buffer 20 and the second external reference voltage 'Vref_ext2' is applied to the data buffer 30.

Performing a test before the package state of semiconductor memory apparatuses, i.e. in the wafer state, is called a wafer test.

The semiconductor memory apparatuses are operated at a low speed because the test is performed by connecting a test device to the semiconductor memory apparatuses in the wafer test.

Semiconductor memory apparatuses designed to be supplied with the first external reference voltage 'Vref_ext1' and the second external reference voltage 'Vref_ext2' through different pads to perform a high-speed operation are supplied with the first and second external reference voltages 'Vref_ext1', 'Vref_ext2' from different pads in the wafer test performing a low-speed operation.

Conventional semiconductor memory apparatuses use the pad, which is needed for a high-speed operation, for a low-speed operation in the same way, such that the number of pads unnecessarily increases. Further, the number of lines connecting a test device with the semiconductor memory apparatus increases in the wafer test.

SUMMARY

A semiconductor memory apparatus capable of controlling the number of pads used for a high-speed operation and a low-speed operation is described herein.

According to one embodiment a semiconductor memory apparatus includes: a reference voltage selecting unit configured to selectively output a first external reference voltage and a second external reference voltage as a selection reference voltage in accordance with whether to perform a wafer test; an address buffer configured to generate an internal address by buffering an external address in accordance with the selection reference voltage; a command buffer configured to generate an internal command by buffering an external command in accordance with the selection reference voltage; and a data buffer configured to generate internal data by buffering an external data in accordance with the second external reference voltage.

According to another embodiment a semiconductor memory apparatus includes: a reference voltage selecting unit configured to output a first external reference voltage or a second external reference voltage as a selection reference voltage in accordance with a low-speed operation and a high-speed operation; an address buffer configured to generate an internal address by buffering an external address in accordance with the selection reference voltage; and a data buffer configured to generate internal data by buffering external data in accordance with the second external reference voltage.

According to another embodiment a semiconductor includes: a clock cycle detecting unit configured to enable a detection signal when the cycle of a clock signal is more than a predetermined cycle; a voltage selecting unit configured to selectively output a first voltage and a second voltage as a selection voltage in response to the detection signal; a first internal circuit configured to receive the first voltage; and a second internal circuit configured to receive the selection voltage.

These and other features, aspects, and embodiments are described below in the "Detailed Description."

BRIEF DESCRIPTION OF THE DRAWINGS

Features, aspects, and embodiments are described in conjunction with the attached drawings, in which.

DETAILED DESCRIPTION

Figure 1:
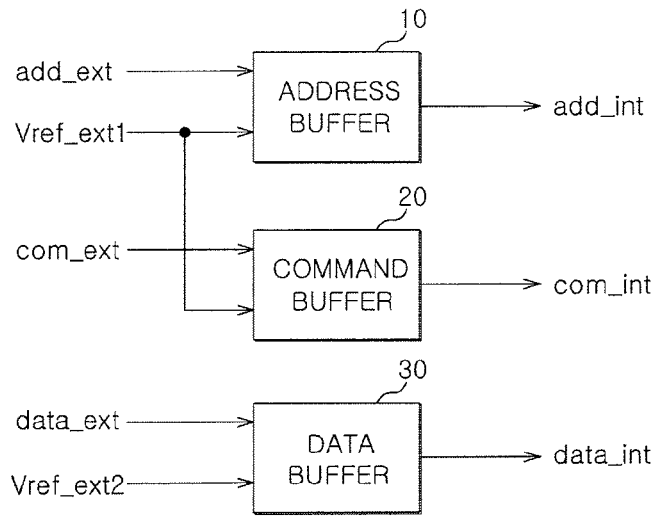
FIG. 1 is a diagram illustrating a configuration of a conventional semiconductor memory apparatus.
Figure 2:
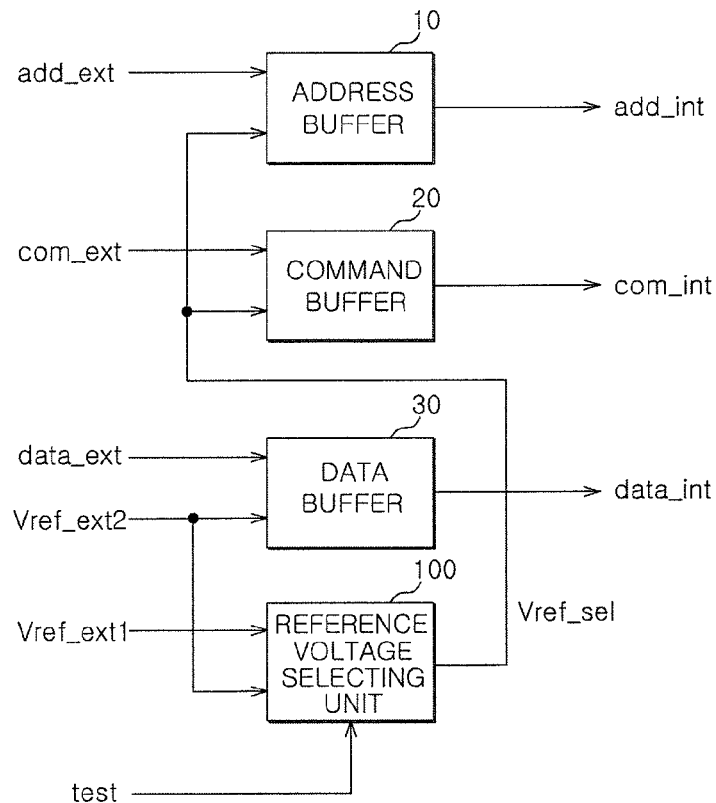
FIG. 2 is a diagram illustrating a configuration of a semiconductor memory apparatus according to an embodiment.

A semiconductor memory apparatus 1 according to an embodiment, as shown in FIG. 2, is configured to include an address buffer 10, a command buffer 20, a data buffer 30, and a reference voltage selecting unit 100.

The reference voltage selecting unit 100 selectively outputs a first external reference voltage 'Vref_ext1' and a second external reference voltage 'Vref_ext2' as a selection reference voltage 'Vref_sel' in response to a test signal 'test'.

The address buffer 10 generates an internal address 'add_int' by buffering an external address 'add_ext' in accordance with the selection reference voltage 'Vref_sel'.

The command buffer 20 generates an internal command 'com_int' by buffering an external command 'com_ext' in accordance with the selection reference voltage 'Vref_sel'.

The data buffer 30 generates internal data 'data_int' by buffering the external data 'data_ext' in accordance with the second external reference voltage 'Vref_ext2'. The first external reference voltage 'Vref_ext1' and the second external reference voltage 'Vref_ext2' are voltages applied from the outside to the semiconductor memory apparatus through different pads, and may be at the same voltage level. That is, the first external reference voltage 'Vref_ext1' and the second external reference voltage 'Vref_ext2' may be at the same voltage level, but are outputted from different power sources.

Figure 3:
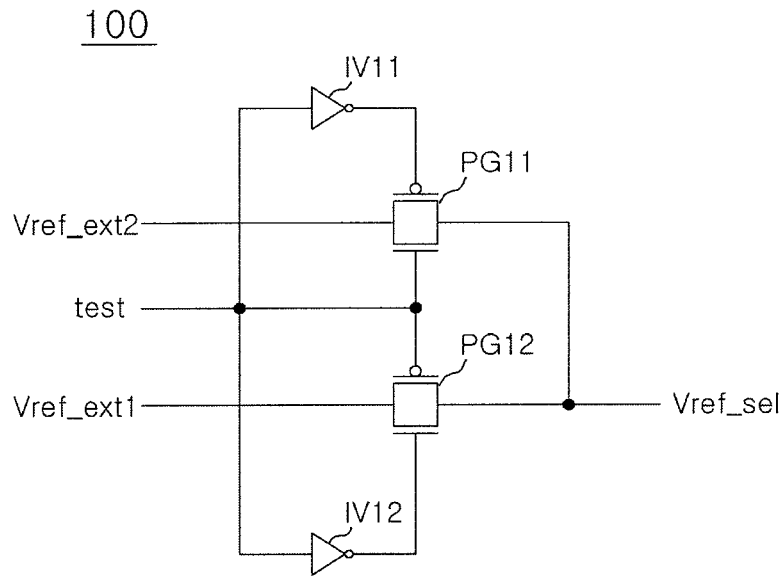
FIG. 3 is a diagram illustrating a configuration of the reference voltage selecting unit shown in FIG. 2.

The reference voltage selecting unit 100, as shown in FIG. 3, is configured to include first and second inverters 'IV11', 'IV12' and first and second pass gates 'PG11', 'PG12', outputs the second external reference voltage 'Vref_ext2' as the selection reference voltage 'Vref_sel' when the test signal 'test' is enabled at a high level, and outputs the first external reference voltage 'Vref_ext1' as the selection reference voltage 'Vref_sel' when the test signal 'test' is disabled at a low level.

The semiconductor memory apparatus 1 having the above configuration according to an embodiment operates as follows.

When a test signal 'test' is disabled, the first external reference voltage 'Vref_ext1' is outputted as a selection reference voltage 'Vref_sel'.

When the test signal 'test' is enabled, a second external reference voltage 'Vref_ext2' is outputted as the selection reference voltage 'Vref_sel'.

When the test signal 'test' is disabled, the address buffer 10 and the command buffer 20 receive the first external reference voltage 'Vref_ext1' and the data buffer 30 receives the second external reference voltage 'Vref_ext2'.

When the test signal 'test' is enabled, the address buffer 10, the command buffer 20, and the data buffer 30 all receive the second external reference voltage 'Vref_ext2'.

The test signal 'test' can be a signal that is enabled in the wafer test. Further, the test signal 'test' can be an operation speed information signal of the semiconductor memory apparatus which is set in advance in a mode register set. A CAS latency signal can be used as the operation speed information signal. The CAS latency signal can be used as the operation speed information signal, because the higher the operation speed of the semiconductor memory apparatus, the more the CAS latency value increases.

A semiconductor memory apparatus according to an embodiment can selectively use voltages that have the same voltage level, but are outputted from different power source terminals, in the wafer test and not in the wafer test, that is, in accordance with a low-speed operation and a high-speed operation. This can reduce the number of pads used when the semiconductor memory apparatus performs a low-speed operation as compared with when performing a high-speed operation, and can reduce the number of lines connected to the semiconductor memory apparatus from a test device when performing the wafer test. It is possible to test more semiconductor memory apparatuses at one time by reducing the number of lines connected to the semiconductor memory apparatus in the wafer test.

Figure 4:
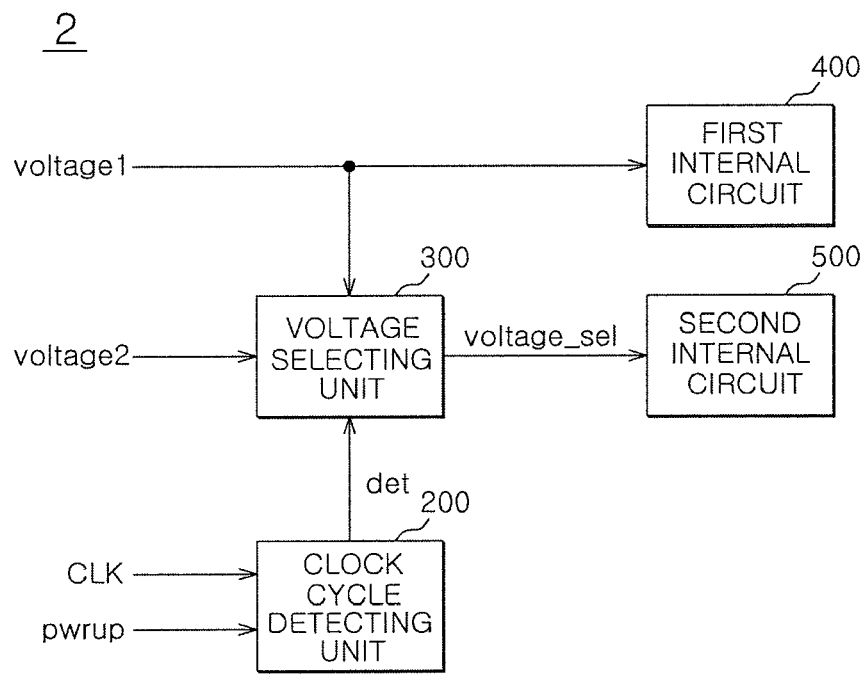
FIG. 4 is a diagram illustrating a configuration of a semiconductor memory apparatus according to another embodiment.

A semiconductor memory apparatus 2 according to an embodiment, as shown in FIG. 4, is configured to include a clock cycle detecting unit 200, a voltage selecting unit 300, a first internal circuit 400, and a second internal circuit 500.

The clock cycle detecting unit 200 detects the cycle of a clock 'CLK' for a predetermined time after a power-up signal 'pwrup' is enabled, and then enables a detection signal 'det' when the cycle of the cycle is shorter than a predetermined cycle.

The voltage selecting unit 300 selectively outputs a first voltage 'voltage1' and a second voltage 'voltage2' as a selection voltage 'voltage_sel' in response to the detection signal 'det'.

The first internal circuit 400 receives the first voltage 'voltage1'.

The second internal circuit 500 receives the selection voltage 'voltage_sel'.

Figure 5:
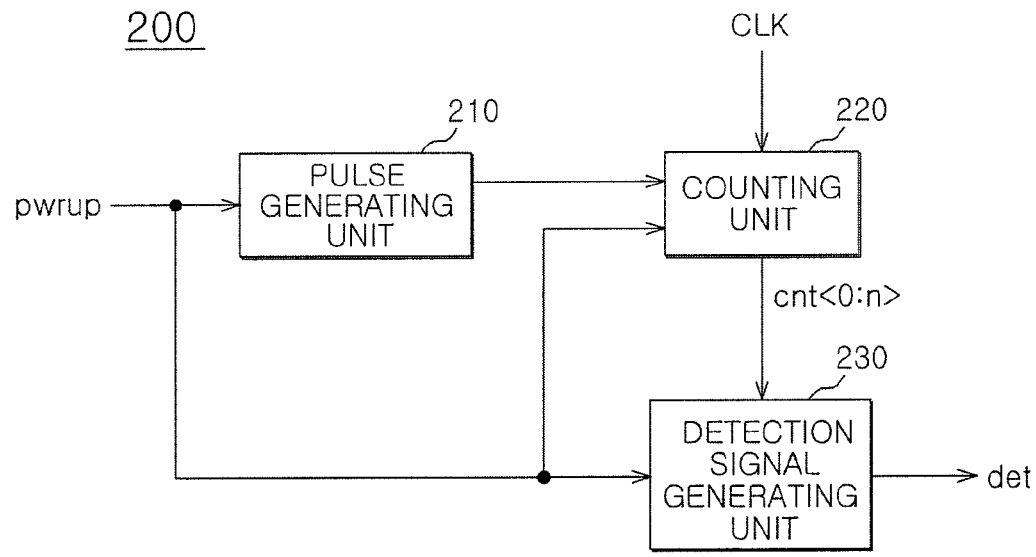
FIG. 5 is a diagram illustrating a configuration of the clock cycle detecting unit shown in FIG. 4.

The clock cycle detecting unit 200, as shown in FIG. 5, is configured to include a pulse generating unit 210, a counting unit 220, and a detection signal generating unit 230.

The pulse generating unit 210 generates a pulse that is enabled for a predetermined time when the power-up signal 'pwrup' is enabled.

The counting unit 220 counts up a counting signal 'cnt<0:n>' of a plurality of bits every time the clock 'CLK' rises during an enable period of the pulse. Further, the counting unit 220 initializes the counting signal 'cnt<0:n>' of a plurality of bits in response to the power-up signal 'pwrup'.

The detection signal generating unit 230 enables the detection signal 'det' when the counted-up counting signals 'cnt<0:n>' of a plurality of bits is more than a predetermined value.

Figure 6:
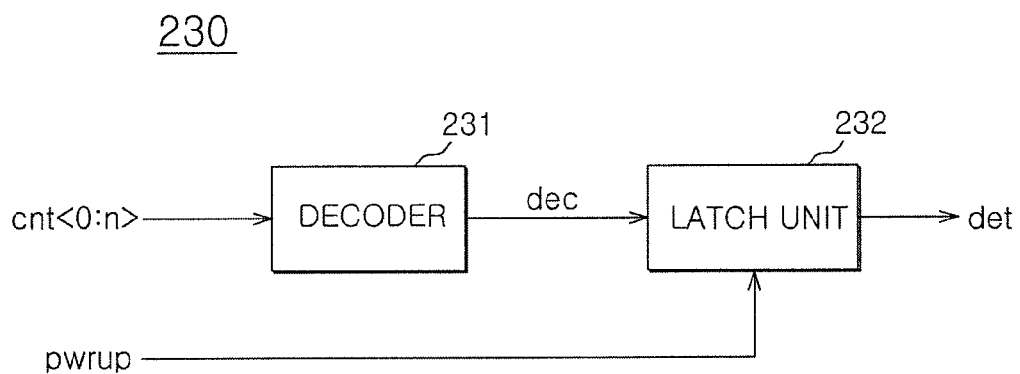
FIG. 6 is a diagram illustrating a configuration of the detection signal generating unit shown in FIG. 5.

The detection signal generating unit 230, as shown in FIG. 6, is configured to include a decoder 231 and a latch unit 232.

The decoder 231 enables a decoding signal 'dec' when a predetermined decoding value is the same as a decoding value of the counting signal 'cnt<0:n>' of a plurality of bits.

The latch unit 232 latches the enabled decoding signal 'dec' and outputs the detection signal 'det'. The latch unit 232 is configured to latch the decoding signal 'dec' only when the decoding signal 'dec' is enabled. The latch unit 232 initializes the detection signal 'det' in response to the power-up signal 'pwrup'.

The semiconductor memory apparatus 2 having the above configuration according to another embodiment operates as follows.

When the power-up signal 'pwrup' is disabled, the counting signal 'cnt<0:n>' of the plurality of bits and the detection signal 'det' are both initialized.

When the power-up signal 'pwrup' is enabled, a pulse that is enabled for a predetermined time is generated.

The counting signal 'cnt<0:n>' of the plurality of bits is counted up every time a clock 'CLK' is generated for an enable section of the pulse.

The counting signal 'cnt<0:n>' of a plurality of bits is decoded. The decoding signal 'dec' is enabled when the predetermined decoding value is the same as the decoding value of the counting signal 'cnt<0:n>' of a plurality of bits.

The enabled decoding signal 'dec' is outputted as the detection signal 'det'.

When the detection signal 'det' is disabled, the first internal circuit 400 and the second internal circuit 500 receive the first voltage 'voltage1'. Meanwhile, when the detection signal 'det' is enabled, the first internal circuit 400 receives the first voltage 'voltage1' and the second internal circuit 500 receives the second voltage 'voltage2'.

The semiconductor memory apparatus 2 according to another embodiment detects the cycle of a clock for a predetermined time, and then when the cycle of the clock is shorter than a predetermined cycle, the semiconductor memory apparatus recognizes a high-speed operation and applies two voltages having the same level and different power sources to corresponding internal circuits. Further, when the cycle of the clock is longer than the predetermined cycle, the semiconductor memory apparatus recognizes a low-speed operation, and commonly applies one of the two voltages having the same level and different power sources to both of the internal circuit.

As a result, the semiconductor memory apparatus according to another embodiment can reduce the number of pads, which are used in the high-speed operation of the semiconductor memory apparatus, in the low-speed operation, when the first and second voltages 'voltage1', 'voltage2' are voltages applied from the outside.

Further, the semiconductor memory apparatus according to another embodiment can reduce current consumption of the semiconductor memory apparatus, because it only needs to generate one voltage of the two voltages in the low-speed operation, when the first and second voltages 'voltage1', 'voltage2' are voltages generated inside.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor memory apparatus comprising:
a reference voltage selecting unit configured to selectively output a first external reference voltage and a second external reference voltage as a selection reference voltage in accordance with whether to perform a wafer test;
an address buffer configured to generate an internal address by buffering an external address in accordance with the selection reference voltage;
a command buffer configured to generate an internal command by buffering an external command in accordance with the selection reference voltage; and
a data buffer configured to generate internal data by buffering an external data in accordance with the second external reference voltage.

2. The semiconductor memory apparatus according to claim 1, wherein the first external reference voltage and the second external reference voltage are at the same voltage level, but are applied to the semiconductor memory apparatus through different pads.

3. The semiconductor memory apparatus according to claim 2, wherein the reference voltage selecting unit selectively outputs the first external reference voltage and the second external reference voltage as the selection reference voltage in response to a test signal.

4. The semiconductor memory apparatus according to claim 3, wherein the reference voltage selecting unit outputs the second external reference voltage as the selection reference voltage when the test signal is enabled, and outputs the first external reference voltage as the selection reference voltage when the test signal is disabled.

5. A semiconductor memory apparatus comprising:
a reference voltage selecting unit configured to selectively output a first external reference voltage and a second external reference voltage as a selection reference voltage in accordance with a low-speed operation and a high-speed operation;
an address buffer configured to generate an internal address by buffering an external address in accordance with the selection reference voltage; and
a data buffer configured to generate internal data by buffering external data in accordance with the second external reference voltage.

6. The semiconductor memory apparatus according to claim 5, wherein the reference voltage selecting unit selectively outputs the first external reference voltage and the second external reference voltage as the selection reference voltage in response to a control signal.

7. The semiconductor memory apparatus according to claim 6, wherein the control signal is an operation speed information signal of the semiconductor memory apparatus.

8. The semiconductor memory apparatus according to claim 7, wherein the operation speed information signal includes a CAS latency signal.

* * * * *